US012702004B2

(12) United States Patent
Colgan et al.

(10) Patent No.: US 12,702,004 B2
(45) Date of Patent: Aug. 4, 2026

(54) THERMAL EXPANSION MATCHED CHIP MODULE WITH INTEGRATED LIQUID COOLING

(71) Applicant: International Business Machines Corporation, Armonk, NY (US)

(72) Inventors: Evan Colgan, Montvale, NJ (US); Jae-Woong Nah, Closter, NJ (US); Katsuyuki Sakuma, Fishkill, NY (US); Kamal K. Sikka, Poughkeepsie, NY (US); Joshua M. Rubin, Albany, NY (US); Frank Robert Libsch, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 649 days.

(21) Appl. No.: 18/083,554

(22) Filed: Dec. 18, 2022

(65) Prior Publication Data

US 2024/0203822 A1     Jun. 20, 2024

(51) Int. Cl.
*H01L 23/473* (2006.01)
*H01L 23/00* (2006.01)
(Continued)

(52) U.S. Cl.
CPC ........... *H10W 40/47* (2026.01); *H10W 90/00* (2026.01); *H10W 70/635* (2026.01);
(Continued)

(58) Field of Classification Search
CPC ............. H01L 23/473; H01L 23/49827; H01L 25/0655; H01L 25/18; H01L 2924/0665;
(Continued)

(56) References Cited

U.S. PATENT DOCUMENTS 4,561,040 A   12/1985 Eastman
5,099,311 A   3/1992 Bonde
(Continued)

FOREIGN PATENT DOCUMENTS

CN        1728365      2/2006
CN        120380595 A  7/2025
(Continued)

OTHER PUBLICATIONS

Ahearn et al., "Silicon Heat Sink Method to Control Integrated Circuit Chip Operating Temperatures", An IP.com Prior Art Database Technical Disclosure, IP.com No. IPCOM000066155D, IP.com Electronic Publication Date: Feb. 19, 2005, 4 pages.
(Continued)

*Primary Examiner* — Peniel M Gumedzoe
(74) *Attorney, Agent, or Firm* — Harrity & Harrity, LLP

(57) ABSTRACT

A chip and cooler assembly includes an active or passive interposer that has a front side and a back side. Integrated circuit chips are mounted onto the back side of the interposer. Each of the chips has a front side that is attached to the interposer and a back side that faces away from the interposer. Gaps separate the chips. The assembly also includes a frame that is fitted into the gaps between the chips. The frame is CTE-matched to the chips. The frame and the chips define a back side surface. A cooler module is attached to the back side surface. The cooler module is CTE-matched to the chips. The cooler module includes a microchannel cooler that is disposed directly against the back sides of the chips and a manifold that is attached to the microchannel cooler opposite the chips. The manifold is CTE-matched to the microchannel cooler.

17 Claims, 8 Drawing Sheets

(51) Int. Cl.

| | |
|---|---|
| *H01L 25/065* | (2023.01) |
| *H01L 25/18* | (2023.01) |
| *H10W 40/47* | (2026.01) |
| *H10W 90/00* | (2026.01) |
| *H10W 70/63* | (2026.01) |
| *H10W 72/00* | (2026.01) |
| *H10W 72/30* | (2026.01) |
| *H10W 74/15* | (2026.01) |

(52) U.S. Cl.
CPC ........ *H10W 72/072* (2026.01); *H10W 72/073* (2026.01); *H10W 72/07354* (2026.01); *H10W 72/325* (2026.01); *H10W 72/347* (2026.01); *H10W 72/352* (2026.01); *H10W 72/354* (2026.01); *H10W 74/15* (2026.01); *H10W 90/724* (2026.01); *H10W 90/734* (2026.01)

(58) Field of Classification Search
CPC ... H10W 40/47; H10W 90/00; H10W 90/724; H10W 90/734; H10W 72/354; H10W 72/073; H10W 72/072; H10W 72/325; H10W 72/347; H10W 72/352; H10W 74/15; H10W 70/635
See application file for complete search history.

(56) References Cited

U.S. PATENT DOCUMENTS

| | | | |
|---|---|---|---|
| 6,399,892 | B1 | 6/2002 | Milkovich |
| 6,746,898 | B2 | 6/2004 | Lin |
| 7,334,630 | B2 | 2/2008 | Goodson |
| 7,888,786 | B2 | 2/2011 | Andry |
| 7,911,044 | B2 | 3/2011 | Yang |
| 8,115,302 | B2 | 2/2012 | Andry |
| 9,035,452 | B2 | 5/2015 | Weaver |
| 9,224,681 | B2 | 12/2015 | Ebefors |
| 9,355,997 | B2 | 5/2016 | Katkar |
| 9,568,960 | B2 | 2/2017 | Colgan |
| 9,852,960 | B2 | 12/2017 | Colgan |
| 10,741,468 | B2 | 8/2020 | Groothuis et al. |
| 11,043,478 | B2 | 6/2021 | Traverso |
| 11,195,789 | B2 | 12/2021 | Hoffmeyer |
| 2006/0002088 | A1 | 1/2006 | Bezama et al. |
| 2006/0103011 | A1 | 5/2006 | Andry |
| 2006/0180924 | A1* | 8/2006 | Andry .................. H01L 23/473 257/E23.098 |
| 2013/0228914 | A1 | 9/2013 | Di Stefano |
| 2016/0165755 | A1 | 6/2016 | Bodenweber |
| 2016/0276294 | A1* | 9/2016 | Katkar .................. H01L 24/97 |
| 2020/0118907 | A1 | 4/2020 | Brunschwiler |
| 2020/0411313 | A1 | 12/2020 | Kim |
| 2022/0217845 | A1 | 7/2022 | Salmon |

FOREIGN PATENT DOCUMENTS

| | | |
|---|---|---|
| DE | 112023005300 T5 | 10/2025 |
| GB | 2641611 A | 12/2025 |
| WO | 2024/131431 A1 | 6/2024 |

OTHER PUBLICATIONS

Author Unknown, "Impinging Heat Sink with flow-through passages for Cooling Multi-Component Modules", An IP.com Prior Art Database Technical Disclosure, IP.com No. IPCOM000013376D, IP.com Electronic Publication Date: Jun. 18, 2003, 4 pages.

Berding, "Multiple Thermal Expansion Coefficient Substrates", An IP.com Prior Art Database Technical Disclosure, IP.com No. IPCOM000061499D, IP.com Electronic Publication Date: Mar. 9, 2005, 3 pages.

Brady et al., "Alternative Metallurgy for Glass Ceramic Modules", An IP.com Prior Art Database Technical Disclosure, IP.com No. IPCOM000103820D, IP.com Electronic Publication Date: Mar. 18, 2005, 3 pages.

Brydon, Jr., "Heat Sink", An IP.com Prior Art Database Technical Disclosure, IP.com No. IPCOM000090277D, IP.com Electronic Publication Date: Mar. 5, 2005, 3 pages.

Chu et al., "Curvature Enhanced Jet Cooling for Chips with Heat Sinks", An IP.com Prior Art Database Technical Disclosure, IP.com No. IPCOM000122067D, IP.com Electronic Publication Date: Apr. 4, 2005, 2 pages.

Chu et al., "Silicon Heat Sink for Semiconductor Chip", An IP.com Prior Art Database Technical Disclosure, IP.com No. IPCOM000049037D, IP.com Electronic Publication Date: Feb. 9, 2005, 3 pages.

Clarke, "Low Thermal Expansion Ceramic Having High Fracture Toughness", An IP.com Prior Art Database Technical Disclosure, IP.com No. IPCOM000119684D, IP.com Electronic Publication Date: Apr. 2, 2005, 4 pages.

Disclosed Anonymously, "Compact Multi-Chip or Single Chip Modules for High Temperature Applications Using Flip Chip", An IP.com Prior Art Database Technical Disclosure, IP.com No. IPCOM000139461D, IP.com Electronic Publication Date: Aug. 25, 2006, 8 pages.

Eldridge et al., "Heat Pipe Vapor Cooling Etched Silicon Structure", An IP.com Prior Art Database Technical Disclosure, IP.com No. IPCOM000044925D, IP.com Electronic Publication Date: Feb. 6, 2005, 3 pages.

Gregor et al., "Porous Silicon Interface to Enhance Heat Transfer From Silicon Substrate to Liquid", An IP.com Prior Art Database Technical Disclosure, IP.com No. IPCOM000086371D, IP.com Electronic Publication Date: Mar. 3, 2005, 2 pages.

Howard, "Semiconductor Device Package Having a Substrate With a Coefficient of Expansion Matching Silicon", An P.com Prior Art Database Technical Disclosure, IP.com No. IPCOM000089813D, IP.com Electronic Publication Date: Mar. 5, 2005, 3 pages.

Lacombe et al., "Flexible Heat Conducting Sheet Material for Semiconductor Packages", An IP.com Prior Art Database Technical Disclosure, IP.com No. IPCOM000045633D, IP.com Electronic Publication Date: Feb. 7, 2005, 5 pages.

Noth, "Heat Transfer From Silicon Chips and Wafers", An IP.com Prior Art Database Technical Disclosure, IP.com No. IPCOM000083354D, IP.com Electronic Publication Date: Mar. 1, 2005, 3 pages.

Authorized office Chen Ze, China National Intellectual Property Administration. ISR & WO Related PCT Application PCT/CN2023/133606 on Feb. 7, 2024. Pages: 8.

Chen et al., "Design, integration and performance analysis of a lid-integral microchannel cooling module for high-power chip", Applied Thermal Engineering 198 (2021): 117457, Aug. 16, 2021, 11 pages.

Colgan et al., "A Practical Implementation of Silicon Microchannel Coolers for High Power Chips", IEEE transactions on components and packaging technologies 30.2, Jun. 2007, pp. 218-225.

Lapedus, "Next-Gen 3D Chip/Packaging Race Begins", Retrieved from: https://semiengineering.com/next-gen-3d-chip-packaging-race-begins/, Jan. 31, 2022, 21 pages.

Moore, "Behind Intel's HPC Chip that Will Pierce the Exascale Barrier Ponte Vecchio packs in a lot of silicon to power the Aurora supercomputer", Retrieved from: https://spectrum.ieee.org/intel-s-exascale-supercomputer-chip-is-a-master-class-in-3d-integration, Feb. 25, 2022, 9 pages.

Unknown, "Silicon Capacitors LPSC Series", Retrieved from: https://web.archive.org/web/20211207130308/https://www.murata.com/en-us/products/capacitor/siliconcapacitors/overview/lineup/lpsc, Dec. 7, 2021, 4 pages.

Unknown, "Technical Details of HermeS®", Retrieved from: https://www.schott.com/en-us/products/hermes-p1000280/technical-details, Retrieved from the Internet on Sep. 2, 2025, 5 pages.

* cited by examiner

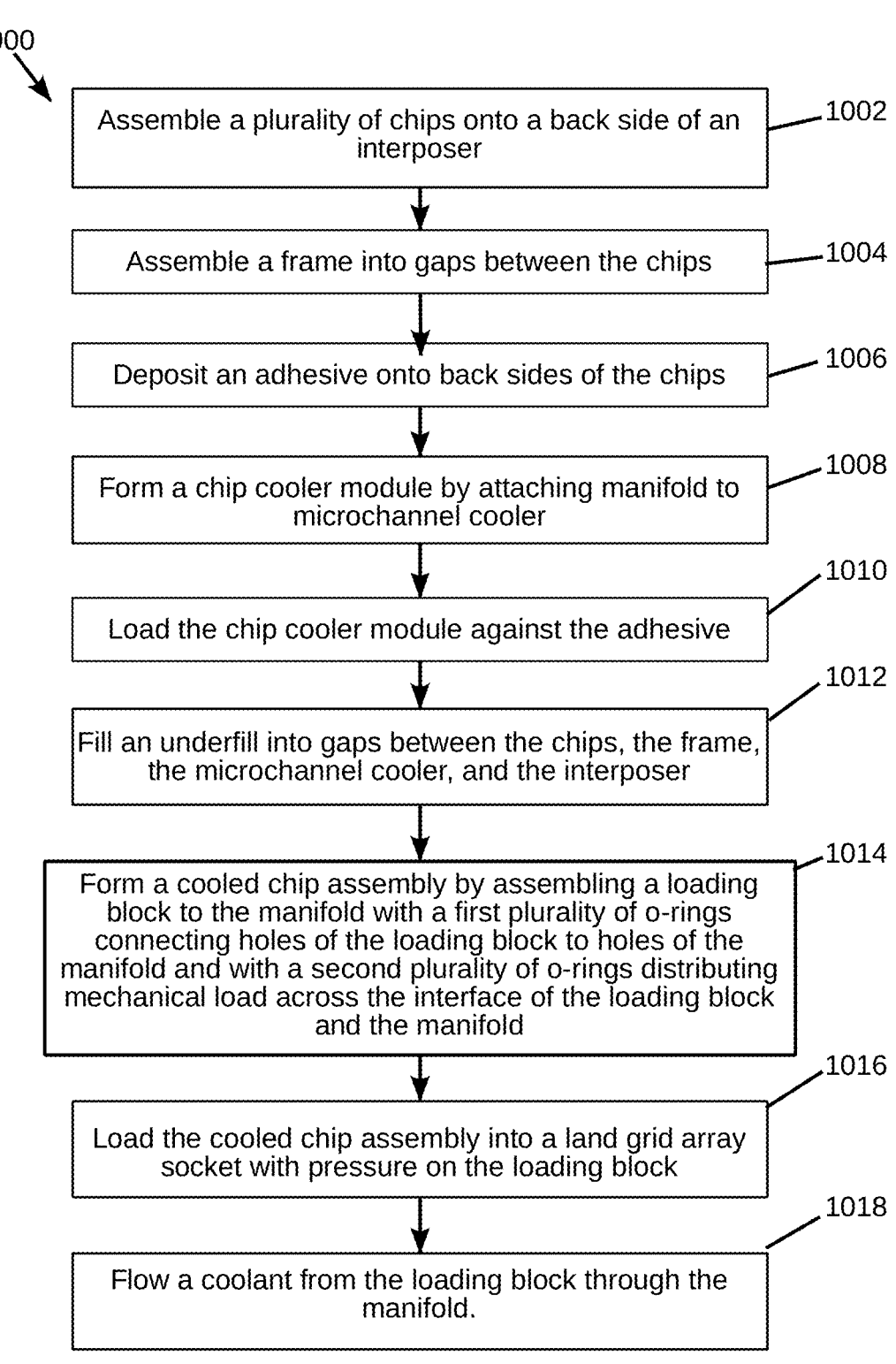

1000

Assemble a plurality of chips onto a back side of an interposer — 1002

Assemble a frame into gaps between the chips — 1004

Deposit an adhesive onto back sides of the chips — 1006

Form a chip cooler module by attaching manifold to microchannel cooler — 1008

Load the chip cooler module against the adhesive — 1010

Fill an underfill into gaps between the chips, the frame, the microchannel cooler, and the interposer — 1012

Form a cooled chip assembly by assembling a loading block to the manifold with a first plurality of o-rings connecting holes of the loading block to holes of the manifold and with a second plurality of o-rings distributing mechanical load across the interface of the loading block and the manifold — 1014

Load the cooled chip assembly into a land grid array socket with pressure on the loading block — 1016

Flow a coolant from the loading block through the manifold. — 1018

FIG. 10

THERMAL EXPANSION MATCHED CHIP MODULE WITH INTEGRATED LIQUID COOLING

BACKGROUND

The present invention relates to the electrical, electronic, and computer arts, and more specifically, to thermal management of integrated circuit assemblies.

Integrated circuits generate waste heat while they operate. This heat, if not removed, can degrade the performance of the circuits. In the worst case, retained heat can lead to thermal runaway. Accordingly, it is desirable to remove waste heat from integrated circuit chips. Typically, this is done using cold plates that are attached to the chips. In a multi-chip assembly, a discrete cold plate can be attached to each individual chip. Alternatively, a conformable thermal interface material can be used as an intermediate layer between multiple chips and a single shared cold plate. Sometimes, a cold plate will be made flexible in order to accommodate multiple chips that may have different thicknesses or heights. Typically, cold plates are made of a metal in order to achieve high thermal conductivity.

An electronics module, or package, typically needs to provide power, input/output (I/O) connections, cooling, and mechanical protection to the active semiconductor devices which it contains. In the packaging of semiconductor chips, typically an organic substrate is used which fans out the fine pitch, typically 0.15 to 0.2 mm, controlled collapse chip connector (C4) solder bumps on the silicon die to larger pitch, typically 1.0 to 1.2 mm, BGA (ball grid array) or LGA (land grid array) connections. With a BGA, the chip package is attached to a printed circuit board (PCB) by reflowing the solder balls to form a permanent connection, whereas an LGA type interposer provides a connection where the chip package can be readily removed and replaced on the printed circuit board.

For an LGA interposer, or connector/socket, a mechanical load is required to compress springs or other contact elements to form the individual electrical connections. In general, with an organic packaging substrate, a lid formed from a thermally conductive material such as copper is attached to the chip and organic substrate to protect the chip during handling and to add mechanical strength to the organic substrate. A thermal interface material (TIM) is dispensed between the back surface of the chip and the lid to provide a thermal path. If required, a heat sink is then attached using a second TIM layer to the outside surface of the lid. The chip is mounted face, or device side, down on the packaging substrate and connected by C4s.

Typical organic laminates used for packaging chips have a coefficient of thermal expansion (CTE) of about 13-18 ppm/C, which is greater than the silicon CTE, which is about 3 ppm/C. This difference limits the size of chips which can be reliably attached to laminates with C4 solder balls, and the minimum pitch of the solder balls, due to the stresses generated during thermal cycling. The CTE mismatch between the silicon chip and the copper lid (CTE of ~ 17 ppm/C) means that for reliable operation of large chips, compliant and thicker TIM layers are required, which have lower performance than rigid TIM layers such as silver filled epoxy, solder, or metals such as indium.

Current generation multi-chip high performance compute modules incorporate stacked chips, as well as high bandwidth memory chip stacks (HBMs). Lower chips in each stack contain through silicon vias (TSVs). The chip stacks are mounted onto silicon carriers that have multiple wiring layers and TSVs for interconnecting the chips which are mounted on them. The interposers are then attached to organic laminates. A significant advantage of silicon carriers, also called interposers, is that they can be manufactured with finer pitch wiring than organic laminates and since they are CTE-matched to chips, large chips can be mounted onto them with finer pitch solder balls, both of which enable greater data bandwidth between chips. A disadvantage of silicon interposers is that they are generally thin, about 0.05 to 0.2 mm thick, due to the etching process used to form the TSVs, which means that they are fragile and can easily be cracked when they span a large area. Glass which is CTE-matched to silicon can also be used to manufacture carriers or interposers with multiple fine pitch wiring layers and through vias which are in many ways functionally equivalent to silicon carriers. Both silicon and glass are brittle materials and strong in compression but fracture in tension when a critical load is exceeded. The failure strength of silicon and glass depends on the largest existing crack nucleation site. TSVs are crack nucleation sites. Increasingly, stacked chips are joined by "hybrid bonding," where oxide layers and copper connections are bonded directly to each other, and solder bumps are not needed. For some higher power density modules, directly integrating liquid cooling in the lid of the module is being considered to provide improved cooling. Such multi-chip modules as described above, are typically mounted on PCBs using LGA connections, rather than BGAs, so that they are replaceable. For the current state of the art high performance multichip modules, since materials with different CTEs are used, very careful engineering, design, and assembly methods are needed to ensure long term reliable operation. It is desirable that any bending of large area silicon or glass carriers is avoided as that could potentially fracture the carrier.

SUMMARY

Principles of the invention provide techniques for a thermal expansion matched chip module with integrated liquid cooling.

In one aspect, an exemplary chip and cooler assembly includes an interposer that has a front side and a back side, and a plurality of integrated circuit chips that are mounted onto the back side of the interposer. Each of the chips has a front side that is attached to the interposer and a back side that faces away from the interposer. Gaps separate the chips. The chip and cooler assembly also includes a frame that is fitted into the gaps between the chips. The frame is CTE-matched to the chips. The frame and the chips define a back side surface. A cooler module is attached to the back side surface. The cooler module is CTE-matched to the chips. The cooler module includes a microchannel cooler that is disposed directly against the back sides of the chips and a manifold that is attached to the microchannel cooler opposite the chips. The manifold is CTE-matched to the microchannel cooler.

In another aspect, an exemplary method includes assembling a plurality of chips onto a back side of an interposer. The chips are CTE-matched to the interposer. The method also includes assembling a frame into gaps between the chips; depositing an adhesive onto back sides of the chips; and loading a chip cooler module against the adhesive. The microchannel cooler is CTE-matched to the chips and the interposer.

In view of the foregoing, techniques of the present invention can provide substantial beneficial technical effects. For example, one or more embodiments provide one or more of:

A rigid unitary thermal expansion matched multichip module with enhanced integration, cooling, and reliability.

A thick thermal expansion matched manifold that provides stiffness to the module and fluid distribution.

A glass or silicon carrier with a redistribution wiring layer enables fine pitch interconnects and high wiring density for improved chip-chip bandwidth.

A thermal expansion matched microchannel cooler with rigid thermal interface (silver epoxy, solder, or metal) reduces chip operating temperatures, improving reliability and reducing leakage currents.

A fine pitch through via is not required in a carrier with 1 mm pitch land grid array.

Elastomeric seals in the load block on the opposite side of the module from the LGA can be used to provide coolant fluid connections and additional elastomeric seals can be used to evenly distribute mechanical loading without additional fluid connections.

Forming a rigid unitary structure by using an underfill or other filled material to bond together the interposer, frame piece or pieces, microchannel cooler, chips, and filling any major voids or gaps present between the interposer and microchannel cooler.

Some embodiments may not have these potential advantages and these potential advantages are not necessarily required of all embodiments. These and other features and advantages of the present invention will become apparent from the following detailed description of illustrative embodiments thereof, which is to be read in connection with the accompanying drawings.

BRIEF DESCRIPTION OF THE DRAWINGS

FIG. 10 depicts, in a flow chart, an exemplary method according to an aspect of the invention.

DETAILED DESCRIPTION

Figure 1:
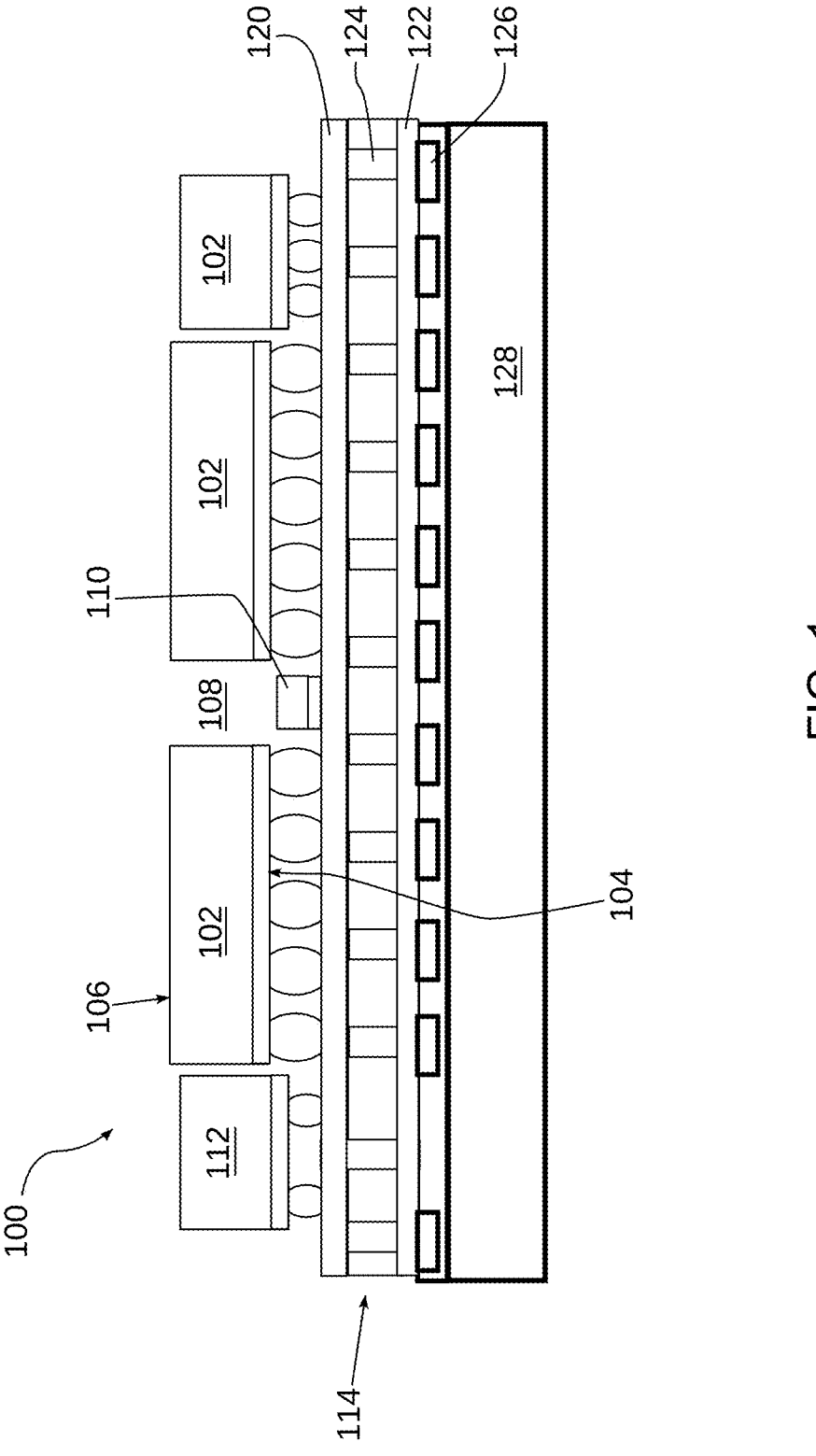
FIG. 1 depicts, in a schematic, a side view of an integrated circuit chip assembly that includes multiple chips on an interposer, according to exemplary embodiments.

FIG. 1 depicts, in a schematic, a side view of a processor module 100 that includes multiple chips 102, 112 on an interposer 114, according to exemplary embodiments. Each of the chips 102, 112 has a front side 104 and a back side 106. In one or more embodiments, the chips 102 are processors or computational units, while the chips 112 are memory, e.g., high bandwidth memory (HBM). Gaps 108 separate adjacent chips. In some of the gaps, there are silicon capacitors 110. In one or more embodiments, the chips 102 are attached to the interposer 114 by controlled collapse chip connectors (C4s), i.e. fine pitch solder bumps, or by hybrid copper/oxide bonding. The interposer 114 also includes redistribution wiring layers (RDLs) 120 and 122, with through-silicon vias (TSVs) 124 connecting the RDLs. At a front side surface, the interposer 114 has land grid array (LGA) pads 126. In one or more embodiments, the TSVs have a pitch of 1 to 1.5 mm or smaller. The RDL 120 is configured to provide signal connections between chips on the top surface of the interposer and distribute power thru the C4s. The TSVs, which connect to the chips thru the RDL 120 and C4s, provide off-module signaling and power. For LGAs which connect to power, multiple TSVs may be used in parallel to reduce the electrical resistance. Depending on the detailed design, RDL layer 122 on the LGA side of the interposer may be present or not, in which case the LGA pads would connect directly to the TSVs. In one or more embodiments, during fabrication of the processor module 100, the LGA side of the interposer 114 can be mounted onto a handler wafer 128 with a removable adhesive layer during fabrication of RDL 120 and chip attachment.

In one or more embodiments, chip stacks such as HBM (high bandwidth memory modules) or thin capacitors (e.g., silicon capacitors) can be included in the processor module 100. In alternate embodiments an active silicon interposer can include additional elements such as integrated decoupling capacitors, active devices for power conversion, or other active devices for directing I/O signals or other purposes. If such devices are added to the silicon interposer, they could be formed on the top, bottom, or both surfaces. In one embodiment, the active silicon interposer could be equivalent to a chip or array of chips with TSVs and LGA pads formed on the back side and with HBM memory stacks or additional active chips bonded to the front surface, as illustrated in FIG. 1.

Figure 2:
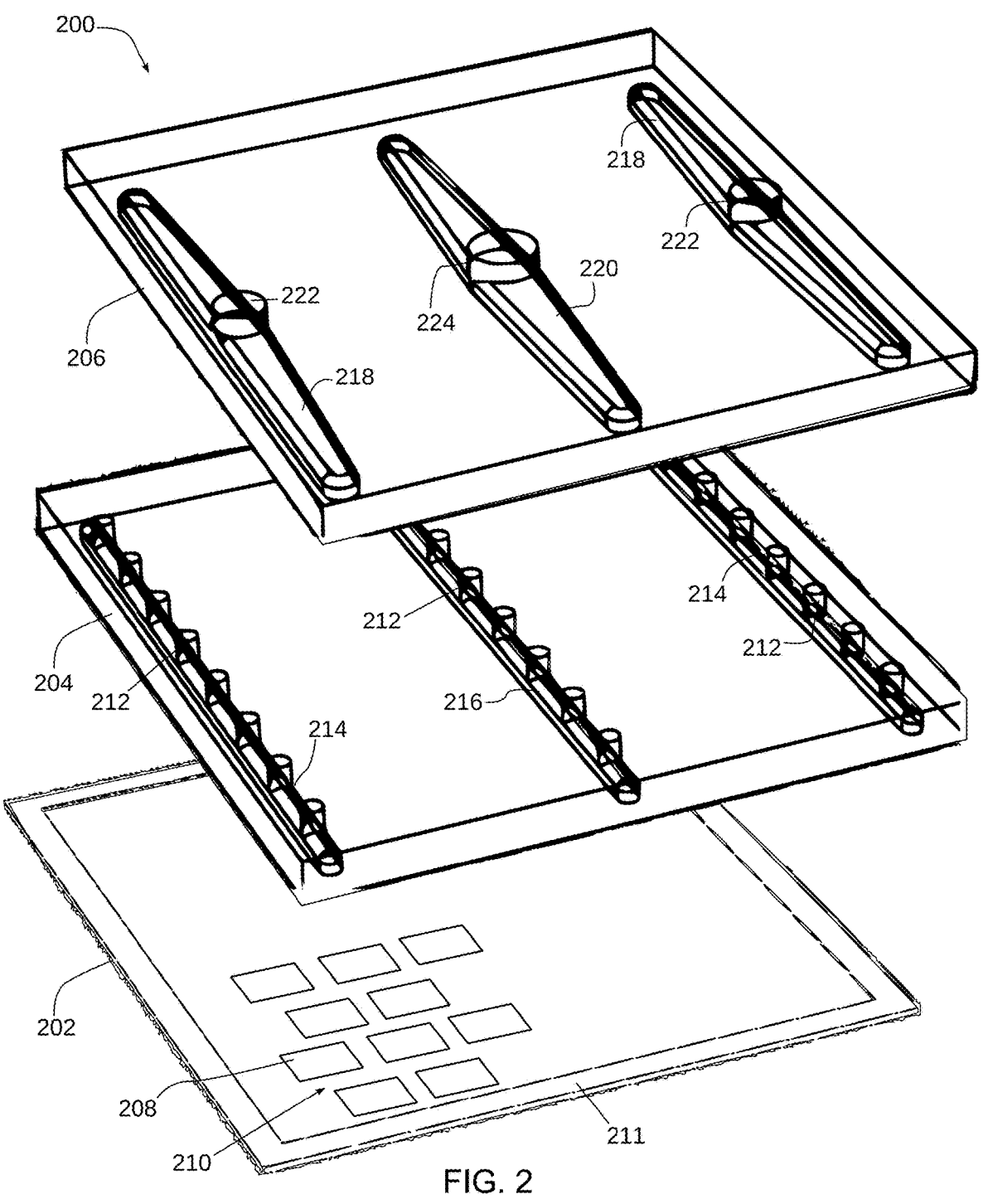
FIG. 2 depicts, in an exploded assembly schematic, a thermal expansion matched chip cooler module, according to exemplary embodiments.

FIG. 2 depicts, in an exploded assembly schematic, a thermal expansion matched chip cooler module 200, according to exemplary embodiments. The module 200 includes a microchannel cooler 202, a lower manifold 204, and an upper manifold 206, which all are bonded together with a rigid material such as a glass frit.

FIG. 2 shows a perspective view of the silicon microchannel cooler 202 where a pattern of staggered fins 208, not to scale, running left to right have been created by using a deep reactive etching process to pattern the silicon to a depth of about 300 microns. The specific geometry of the fins will depend on the details of the application and can be optimized as is well-known to one skilled in the art. The etched microchannels 210 are surrounded on all side by a frame region 211, which may be for example 3.5 mm wide, to allow for the glass manifold layer above to be sealed to the microchannel layer. The nominal dimension of the micro-channel layer is 77×87×0.775 mm.

In one or more embodiments, the glass manifold layers 204, 206 are each about 77×87×5 mm in size and are fabricated from Schott Borofloat® 33 glass (registered mark of SCHOTT AG MAINZ FED REP GERMANY), or other glass materials which are CTE-matched to silicon. The lower glass manifold layer 204 has been machined to form three recessed slots or grooves 214, 216 on the bottom surface and three arrays of through holes or vertical channels 212 that are aligned with these grooves. The grooves 214, 216 are, in one or more embodiments, are about 2.4 mm wide and serve to confine the water flow to the microchannels. The fluid path through the glass uses an array of holes to avoid excessively weakening the glass layer. The upper glass manifold layer 206 has been machined to form tapered manifold channels 218, 220 that extend from central holes 222, 224, so that the tapered channels 218, 220 overlap, and provide fluid to/from, the holes 212 in the lower manifold layer after assembly of the chip cooler module 200. In an exemplary, nonlimiting embodiment, the glass layers and microchannel layer are permanently rigidly joined by using a glass frit material, such as Ferro 11-036 (manufactured by Ferro Corporation of Mayfield Heights, Ohio), between them.

In operation, cooling fluid is provided to the central inlet 224 on the top surface of the glass microchannel cooler from the LGA loading block 700 (shown in FIG. 7) through a compliant seal such as an O-ring. The coolant then flows along the tapered channel 220 in the upper glass manifold layer until flowing down through the holes 212 into the recessed channel 216 on the bottom of the lower glass manifold layer. From the channel or groove 216, the coolant flows across the microchannel layer 202 to an outlet recessed channel 214 on the bottom of the lower glass manifold layer. From the groove or channel 214, the coolant then flows up through a hole 212 to a tapered outlet manifold 218 on the bottom surface of the upper glass manifold layer, and then to an outlet opening 222. The outlet opening 222 is sealed by a compliant member to a fluid channel in the LGA loading block 700. Alternate configurations are also possible.

In one or more embodiments, the fins 208 and channels 210 of the silicon microchannel cooler 202 are formed by deep reactive-ion etching (DRIE), which is a highly aniso-tropic etch process used to create deep penetration, steep-sided holes and trenches in silicon wafers/substrates, typically with high aspect ratios. In one or more embodiments, the manifold layers 204, 206 are formed by machining polished plates of borosilicate glass. In one or more embodiments, the microchannel cooler and the manifold layers are assembled and attached by screen printing frit on a pattern across the surfaces, drying, glazing, aligning/stacking, clamping, and firing.

In one or more embodiments, the lower manifold 204 includes a plurality of vertical channels 212 that open onto two outward outlet grooves 214 and a central inlet groove 216. The grooves 214, 216 correspond to outlet chambers 218 and an inlet chamber 220 in the upper manifold 206. Each outlet chamber 218 has an outlet nozzle 222 and the inlet chamber 220 has an inlet nozzle 224. The long direction of the staggered fins in the microchannel cooler 202 are oriented perpendicular to the inlet and outlet grooves. Note that in other embodiments, additional manifold layers may be used depending on the specific application so the use of only two layers in these illustrations should not be considered limiting.

Figure 3:
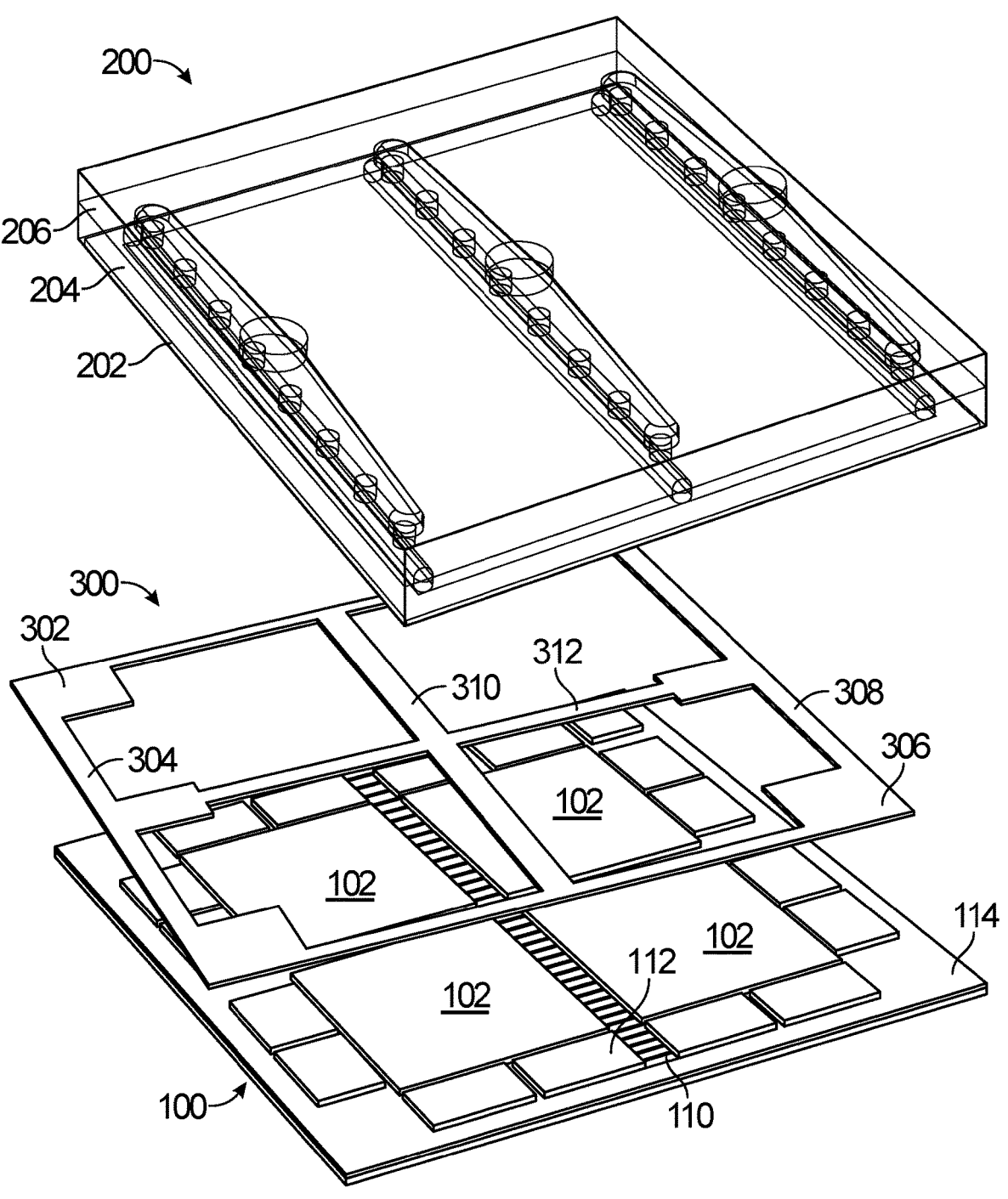
FIG. 3 depicts, in an exploded assembly schematic, the thermal expansion matched chip cooler module that is shown in FIG. 2, the integrated circuit chip assembly that is shown in FIG. 1, and a thermal expansion matched frame, according to exemplary embodiments.

FIG. 3 depicts, in an exploded assembly schematic, the thermal expansion matched chip cooler module 200 that is shown in FIG. 2, the processor module 100 that is shown in FIG. 1, and a thermal expansion matched frame 300, according to exemplary embodiments. The frame 300 includes edges 302, 304, 306, 308 and cross pieces 310, 312. In one or more embodiments, portions of the cross pieces 310, 312 that overlie the capacitors 110 are thinner than the edges 302, 304, 306, 308. Thus, the frame 300 fits into the gaps 108 between the chips 102 on the processor module 100 to provide a uniform surface to which the module 200 can be attached. The frame 300 additionally extends beyond the chips 102, 112 to the edges of the interposer 114 and also to the edges of the microchannel cooler 202. In other words, the frame 300 occupies space around the chips 102 and between the interposer 114 and the microchannel cooler 202. In one or more embodiments, the frame 300 or separate pieces of the frame are made from CTE-matched glass (i.e. glass that has the same coefficient of thermal expansion as silicon), or from silicon. Generally, the frame 300 is intended to occupy the empty space between the populated silicon or glass carrier 114 and the flat base of the chip cooler module 200, except for small gaps about 25 to 200 microns tall, which will subsequently be filled with an underfill or other filled material. This serves to increase the strength and rigidity of the final structure and minimizes the volume fraction of the module which is not fully CTE-matched to silicon. In the preferred embodiment, the spacer frame is composed of a material which is CTE-matched to silicon, such as silicon or Borofloat® 33 glass, and does not need to be a single piece but could be multiple pieces or even layers of pieces (see FIGS. 8 and 9 for alternate constructions 800, 900 of the frame 300).

In one or more embodiments, the chips 102 are attached to the carrier or interposer with 150-micron pitch C4 solder balls, the HBM modules 112 are attached to the carrier with 55-micron pitch microbumps, and the capacitors 110 and optional EEPROM chip(s) are also attached using solder. In a particular embodiment, the interposer 114 is 77×87×0.5 mm in size and the chips 102 are each 30×25 mm in size. The silicon, or glass, carrier can be thicker than typical because the through via pitch requirement is relaxed to just 1 mm. Interposers fabricated from glass CTE-matched to silicon with a via pitch of 0.25 mm and a thickness of 0.5 mm are commercially available. An exemplary CTE-matched glass is Borofloat® 33 glass, which is available from SCHOTT North America, Inc. of Rye Brook, New York. Generally, "CTE-matched" in context of this disclosure means matched within 5 percent for the respective average of values at 20 C and 300 C. In an exemplary embodiment, which is not limiting on the scope of the invention, the handler 128 is about 0.775 mm thick as are the processor chips 102; the HBM stacks are about 0.72 mm thick; and commercially available silicon capacitors are used, which may be as thin as 0.1 mm thick.

In one or more embodiments, the chips 102 are attached to the carrier or interposer with copper-oxide hybrid bonds, copper-copper bonds, or any other solid-state bond, fusion bond, or other permanent bond. Bonding can occur at chip or wafer scale. Then frame 300 can be bonded to the carrier with adhesive, epoxy, solder, copper-oxide hybrid bonds, copper-copper bonds, or any other suitable bond. Depending on the thermal processing requirements of the gap fill material and the mechanical properties desired, the frame bonding material can be chosen appropriately to withstand the required downstream processing. The gaps between the dies and between the dies and the frame can be substantially equal to enable straightforward gap filling processes. The gap fill can utilize organic or inorganic materials. Organic materials, as described in alternate embodiments can include underfill. Inorganic gap fill materials can include silicon-based materials or other dielectric or semiconductor materials. Silicon-based materials, or other semiconductors or dielectrics, can enable CTE matching of the gap fill material to the adjacent dies and frame. Exemplary materials include silicon nitrides, silicon oxides, SiCOH, SiCN. For example, silicon dioxide has a CTE of about $0.6 \times 10^{-6}/K$ whereas germanium has a CTE of about $5.8 \times 10^{-6}/K$. The silicon-based gap fill material can be applied or deposited at die or wafer level. Silicon-based gap fill material can be deposited by various chemical vapor deposition techniques, such as plasma enhanced chemical vapor deposition (PECVD) or low pressure chemical vapor deposition (LPCVD). Additionally, silicon inks and pastes can be deposited at low temperatures. Silicon can also be sputtered at low temperatures. Depending on thermal limits of the chip interposer assembly, deposition temperatures can be kept below 400 C or 450 C. Alternatively, gap fill materials can be deposited at low temperatures (e.g. 200 C) and annealed at moderate temperatures (e.g. 400 C) without negatively impacting the copper features in the chips and carrier. Encapsulation of the chips and carrier may be achieved first with a thin inorganic material followed by other hard dielectric or semiconductor layers. Deposition techniques typically deposit materials on the backside of the dies and frame, thereby degrading thermal performance of cooling solutions. Grinding, polishing, or etching of films can be performed to planarize and remove the films on the backside of the dies and reveal the chips and the frame. All of the above processing can be performed with a handler that has high temperature compatible temporary bonding films or without a handler if the carrier or interposer is sufficiently thick.

Figure 4:
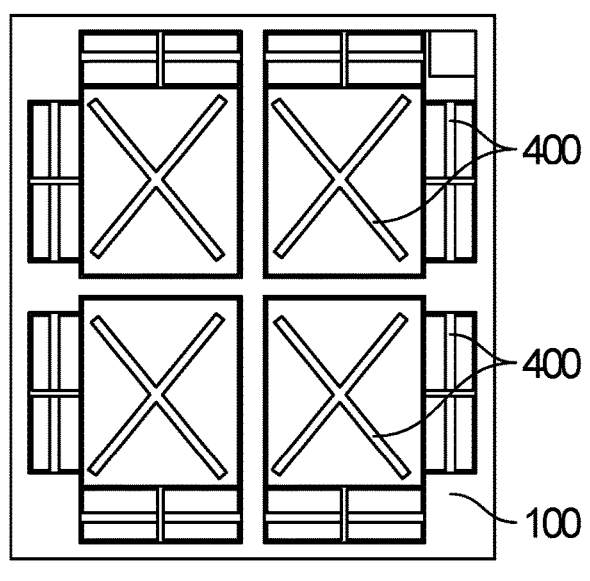
FIG. 4 depicts, in a schematic, a plan (top down) view of the integrated circuit chip assembly that is shown in FIG. 1, with thermal epoxy, according to exemplary embodiments.

FIG. 4 depicts, in a schematic, a plan (top down) view of the processor module 100 that is shown in FIG. 1, with thermal epoxy, or other thermal filled rigid adhesive, 400 applied to the chips 102 and 112, according to exemplary embodiments. The thermal epoxy 400 may be, for example, a silver filled epoxy material, such as Ablestik 965-1L (manufactured by Henkel Corporation of Rocky Hill, Connecticut), which can be dispensed on the top or back side surfaces of the processor chips, HBM memory modules, and other components which require cooling.

Figure 5:
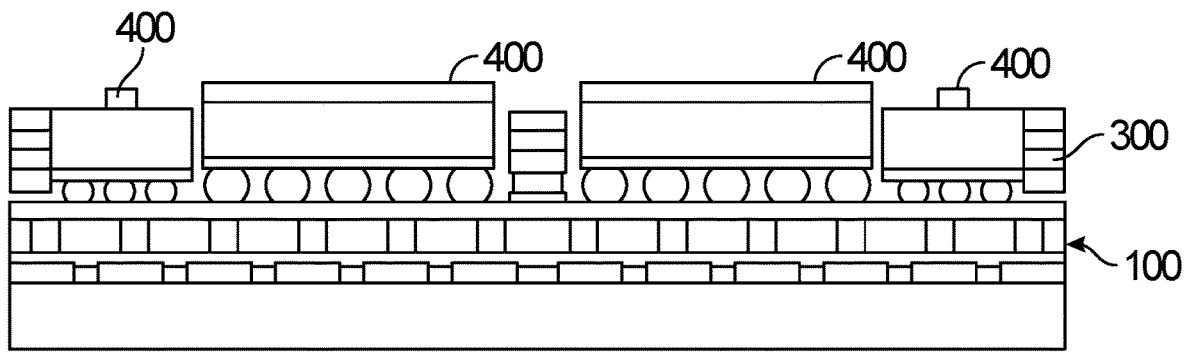
FIG. 5 depicts, in a schematic, a side view of the integrated circuit chip assembly that is shown in FIG. 1, with frame and thermal epoxy, according to exemplary embodiments.

FIG. 5 depicts, in a schematic, a side view of the integrated circuit chip assembly that is shown in FIG. 1, after frame 300 has been placed and thermal epoxy 400 has been deposited, according to exemplary embodiments.

Figure 6:
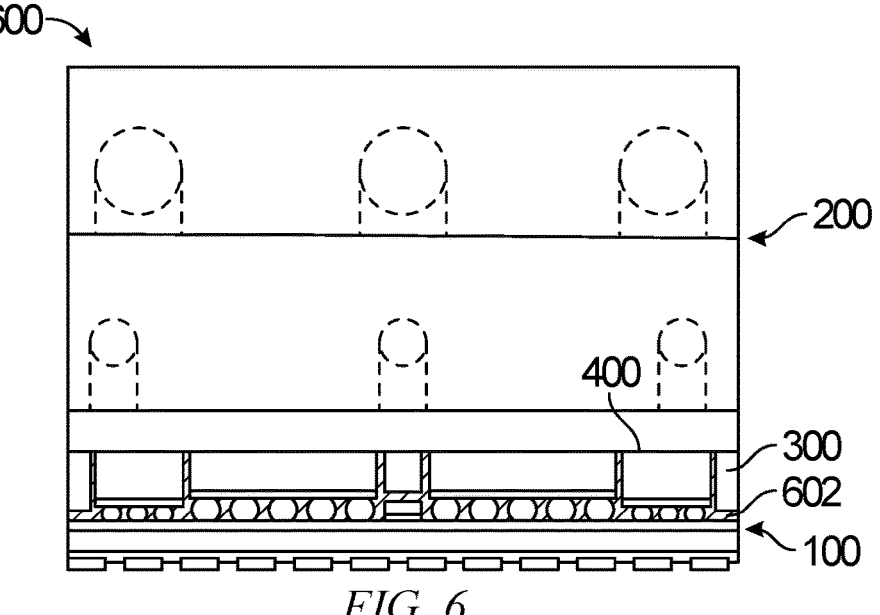
FIG. 6 depicts, in a schematic, a side view of an assembly of the components that are shown in FIG. 3 with the addition of thermal epoxy and underfill and after the removal of the handler.

FIG. 6 depicts, in a schematic, a side view of an assembly 600 of the components that are shown in FIG. 3 to form the thermal expansion matched chip module with integrated liquid cooling. Thus, to assemble the assembly 600: dispense thermal (e.g., silver) epoxy, or other thermal filled rigid adhesive, 400 on the back sides of the chips 102 and 112, stack the frame 300 and the cooler module 200 onto the chip assembly 100, align the parts in a clamping fixture (not shown) clamp together, then cure the silver epoxy in the load fixture. After removing the assembly from the load fixture, the next step is applying underfill. Capillary underfill material, which is generally an epoxy or similar polymer loaded with fine particles of silica or other fillers, is used to fill the gap between the carrier, components, spacer frame, and microchannel cooler. Typically, heat is used to lower the underfill viscosity and speed up the flow of the underfill. In one or more embodiments, after removing the module from the clamping fixture, a vacuum underfill step is used to ensure that all the gaps are filled. In this process, the module and an open container with a pool of underfill are placed in a chamber which is then evacuated. The bottom portion of the module, i.e. the handler, populated carrier, spacer frame, and a portion of the glass microchannel cooler are submerged into the pool of underfill and then the chamber is vented, thus using atmospheric pressure to force the underfill material 602 into all the gaps between the populated carrier and the silicon microchannel. Care can be taken that none of the underfill material enters the glass microchannel cooler through the ports on the top surface. After removing the module from the chamber and wiping any excess underfill off the sides and bottom of the handler, the underfill material is cured. FIG. 6 depicts the underfilled assembly after the handler 128 and adhesive have been removed and the LGA pads are exposed.

Figure 7:
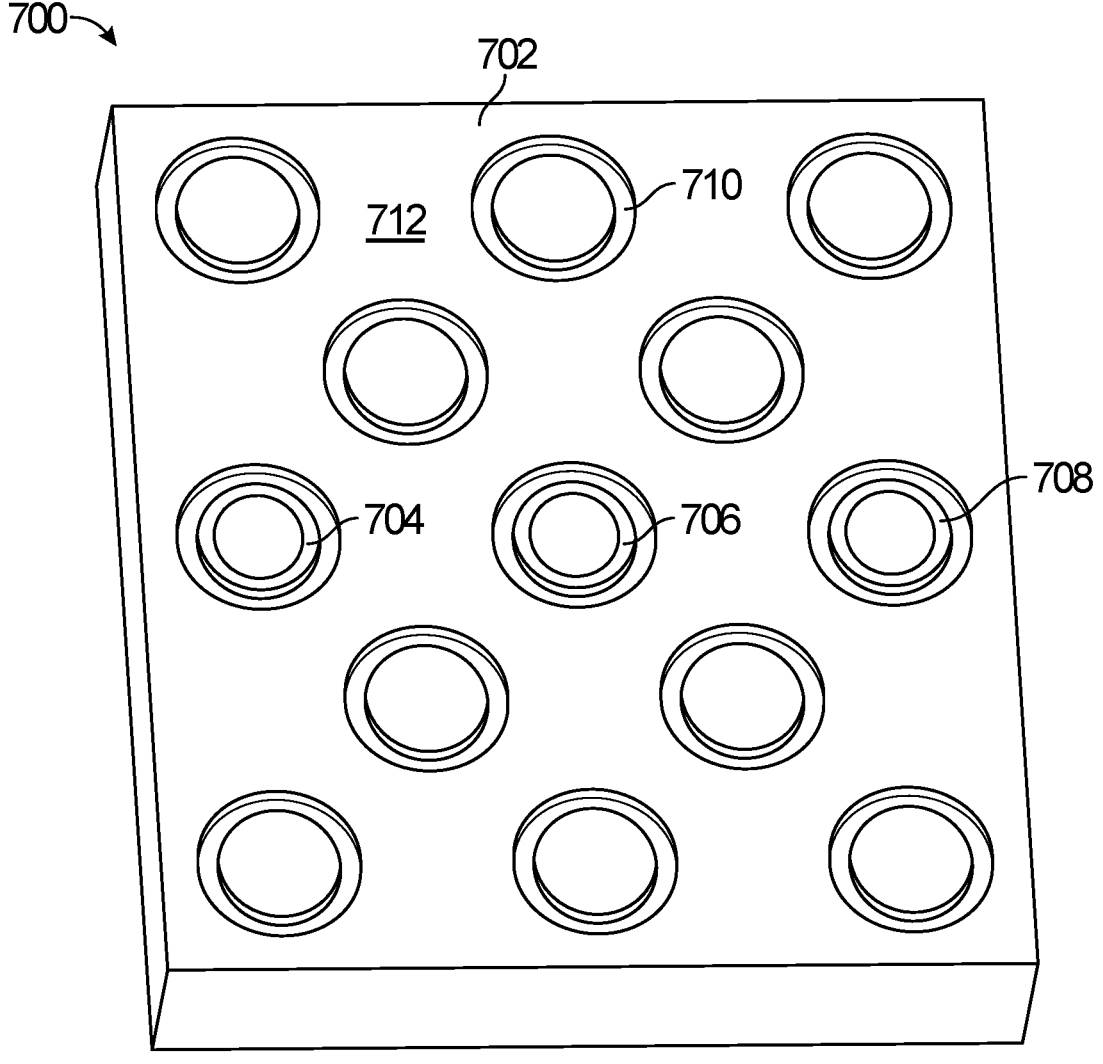
FIG. 7 depicts, in a schematic, an LGA loading block for the assembled components that are shown in FIG. 3.

FIG. 7 depicts, in a schematic, a loading block 700 for clamping the assembled module against the LGA. The loading block 700 has a body 702, in which are formed three holes 704, 706, 708 (corresponding to the inlet and outlet nozzles of the module 200). Circular grooves 710 also are formed in a surface 712 of the body 702 for receiving O-rings (not shown). In use of the loading block, O-rings are inserted into all of the grooves 710 and the loading block 700 that holds the O-rings is pressed down against the module 600 in order seal the fluid inlet/outlet opening and actuate the LGA. Only the O-ring are in contact with the top glass manifold layer. The provision of an evenly-distributed array of O-rings, in addition to the three surrounding the nozzle holes 704, 706, 708, permits compression of the assembly against the LGA socket without cracking the module by uneven application of force.

In one or more embodiments, underfill can be dispensed after curing the silver epoxy, or cured simultaneously with the silver epoxy. The underfill secures the frame to the interposer and to the cooler module to form a rigid unitary structure.

If a handler 128 was used during assembly, remove the handler to expose LGA pads on the interposer. The carrier can be removed by a laser release process, where a laser directed through the handler is used to ablate or decompose the adhesive material or removed using a solvent which dissolves the adhesive material. In the case of a solvent, if the handler is provided with holes to allow the solvent to act more rapidly, tape can be applied to the bottom surface before the vacuum underfill step to prevent the holes from being inadvertently filled with underfill.

A modified assembly process can be used if solder or other metallic thermal interface is to be provided between the chips 102 and 112 and the microchannel cooler 202. Solder or other metallic thermal joining materials can be used to reduce the thermal resistance between the heat dissipating components and microchannel cooler. In such a process, the back surfaces of the heat dissipating chips and memory stacks on the populated carrier can be metallized by evaporation through a metal mask, and likewise, all or part of the bottom of the glass microchannel cooler can be metallized so that solder wets the surfaces. In the process described above, instead of dispensing silver filled epoxy, solder paste or preforms can be placed where desired and a reflow process used to join the components together, before proceeding with the remaining steps of vacuum underfill and handler removal. An additional alternative assembly method is to use Cu to Cu and oxide to oxide hybrid bonding in place of solder balls for joining the chips, HBM memory stack, etc. to the carrier.

With a large LGA socket, a substantial load is needed for actuation. For example, with a 77×87 mm module and a 75×85 array of LGAs at 1 mm pitch, where the typical actuation load is 44 gm/contact, the total required load is 280.5 kg. As mentioned previously, with brittle materials such as glass or silicon, it is important to avoid tensile loads which can result in fracture. For example, a bending force on the described module would result in tensile loads on one surface and compressive loads on the opposite surface. Such tensile loads can be avoided by applying the load as uniformly as possible across the module surface while uniformly supporting the opposite face to avoid any bending forces. In the preferred embodiment, additional mechanical only O-rings, or other compliant means, are used between the LGA loading block and the module to more uniformly distribute the load. In the preferred embodiment, the LGA loading block 700 has a smooth surface facing the module and annular recesses for receiving O-rings, where three of the O-rings also provide fluid inlet or outlets to/from the module. The LGA loading block, through a clamping mechanism, provides a controlled force which clamps together the module, the LGA and the PCB. In one or more embodiments, the PCB has a stiffener plate behind it, to which the clamping mechanism is connected.

FIG. 7 is a schematic view illustrating a potential distribution of O-rings onto the module to more uniformly distribute the LGA load where ten of the O-rings are for mechanical purposes only and three provide fluid connections. FIG. 7 shows the LGA loading block 700 with the grooves 710 for receiving O-rings, which are recessed appropriately so that in one or more embodiments, only the compressed O-rings contact the glass manifold surface, not the loading block. One pertinent benefit of this module structure, beyond being fully CTE-matched, is its greater thickness than prior art modules, as the stiffness of a plate is proportional to the thickness raised to the third power. For the example given, the thickness is about 12 mm, compared to about 4 mm for a typical chip package. The stiffness can be increased further by using a thicker or additional glass layer in the manifold if desired. This greater stiffness allows for a somewhat non-uniform load to be applied by using thirteen O-rings as shown in FIG. 7. The LGA provides a more uniform load from the 1 mm pitch compressible contacts pressing against the bottom surface of the module.

Figure 8:
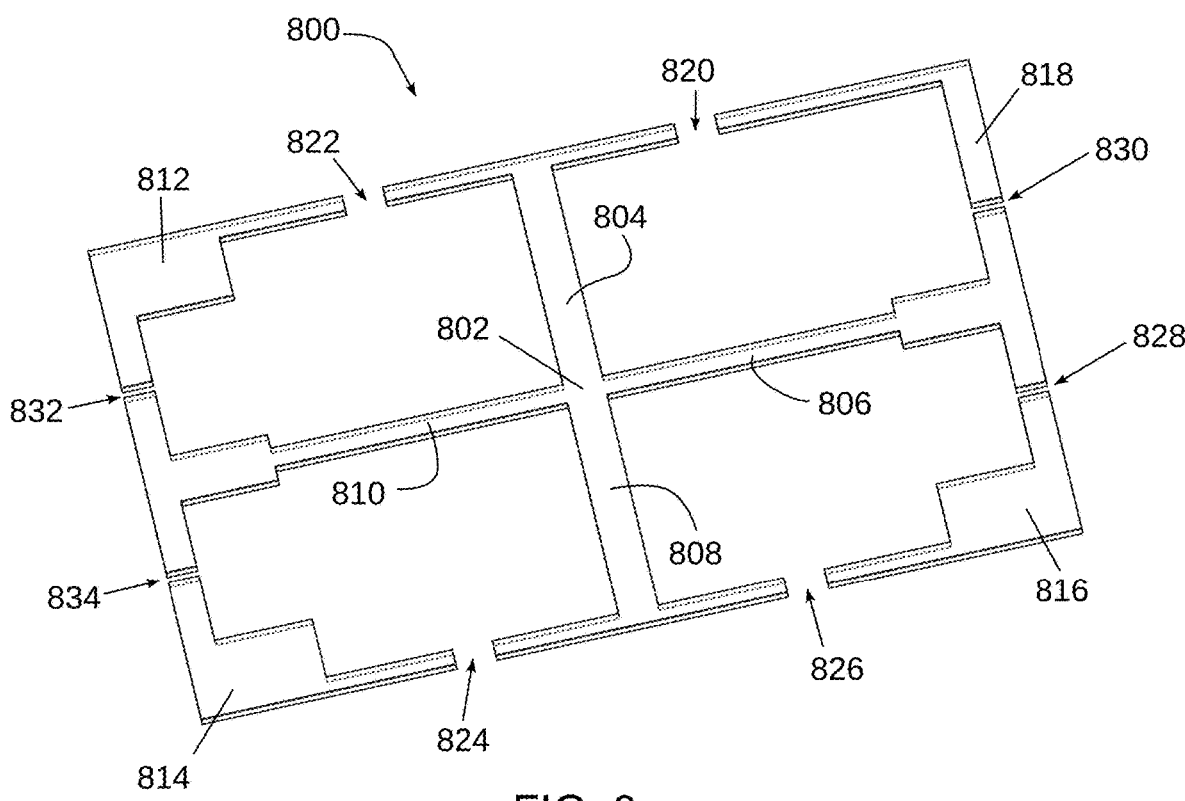
FIG. 8 depicts, in a schematic, a multipiece thermal expansion matched frame, according to exemplary embodiments.

FIG. 8 depicts, in a schematic, a multipiece thermal expansion matched frame 800 that includes a central crosspiece 802, with arms 804, 806, 808, 810. Corner pieces 812, 814, 816, 818 are assembled with the central crosspiece 802 to define fill vents 820, 822, 824, 826 and underfill nozzles 828, 830, 832, 834; during assembly, the underfill is introduced through the nozzles 828, 830, 832, 834, and air vents out through the vents 820, 822, 824, 826 if a conventional atmosphere underfill dispense is used.

Figure 9:
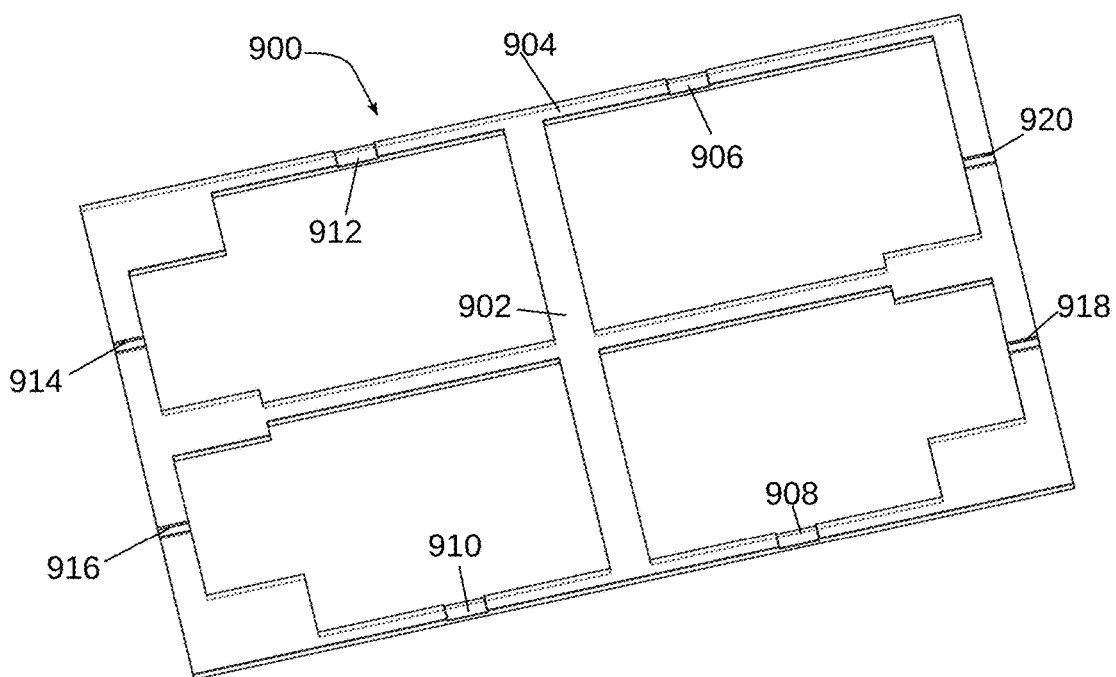
FIG. 9 depicts, in a schematic, a thermal expansion matched frame that includes recessed channels to aid in the flow of underfill, according to exemplary embodiments.

FIG. 9 depicts, in a schematic, a thermal expansion matched frame 900 that has a central crosspiece 902 connected to an edge piece 904, which includes recessed channels 906, 908, 910, 912 for venting air and channels 914, 916, 918, 920 to admit the flow of underfill if a conventional atmosphere underfill dispense is used.

Figure 11:
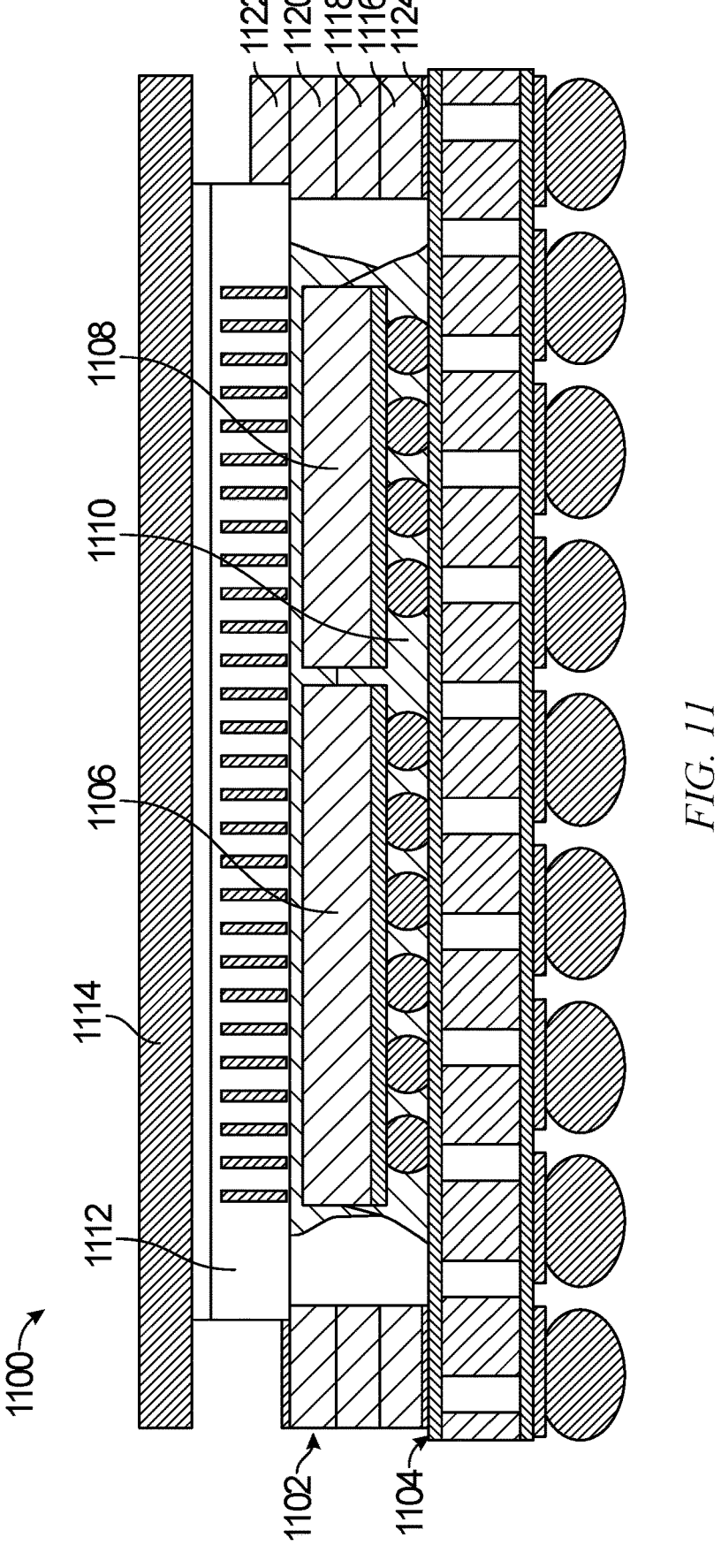
FIG. 11 depicts, in a schematic, a chip and cooler assembly that has a stiffener at each edge of the assembly, according to exemplary embodiments.

FIG. 11 depicts, in a schematic, a chip and cooler assembly 1100 that has a stiffener 1102 at each edge of the assembly, according to exemplary embodiments. The assembly 1100 includes an interposer 1104, a first chip 1106, a second chip 1108, an underfill 1110, a microchannel cooler 1112, and a fluid fitting plate 1114. In one or more embodiments, the fluid fitting plate 1114 is similar to the loading block 700, and has O-rings that directly interface with an upper surface of the microchannel cooler 1112. In one or more embodiments, the fluid fitting plate 1114 is made from stainless steel. In one or more embodiments, the microchannel cooler 1112 is similar to a combination of the cooler manifold upper portion 206 with the microchannel cooler 202 as seen in the cooler module 200 (FIG. 2). In one or more embodiments, the microchannel cooler 1112 is made from silicon for thermal conductivity. In one or more embodiments, the stiffener 1102 is made from multiple layers of silicon 1116, 1118, 1120, 1122 that are joined together; for example, by an adhesive 1124. In one or more embodiments, the top layer 1122 is present at one edge of the assembly but is not present at the opposite edge; advantageously, this can provide an ability for the microchannel cooler 1112 to expand or contract laterally due to temperature changes. Furthermore, adhesive is a non-limiting example of a joining technique for the multiple layers of silicon 1116, 1118, 1120, 1122; other examples include any suitable joining material/method, such as hybrid bond, direct bond, solder, and the like.

Given the discussion thus far, it will be appreciated that, in general terms, an exemplary chip and cooler assembly 600 includes an interposer 114 that has a front side 118 and a back side 116, and a plurality of integrated circuit chips 102, 112 that are mounted onto the back side of the interposer. Each of the chips has a front side 104 that is attached to the interposer and a back side 106 that faces away from the interposer. Gaps separate the chips. The chip and cooler assembly 600 also includes a frame 300 that is fitted into the gaps between the chips. The frame extends beyond the chips to the edges of the interposer. The frame is CTE-matched to the chips. The frame and the chips define a back side surface. A chip cooler module 200 is attached to the back side surface. The chip cooler module is CTE-matched to the chips. The chip cooler module includes a microchannel cooler 202 that is attached to the back sides of the chips and a manifold 204, 206 that is attached to the microchannel cooler opposite the chips. The manifold is CTE-matched to the microchannel cooler.

In one or more embodiments, the chip and cooler assembly 600 also includes a plurality of thinner chips that are embedded in portions of the gaps between the plurality of chips, and the frame is thinner above the thinner chips and is thicker where the thinner chips are not present.

In one or more embodiments, the chips have electrical contacts at their front sides, and the interposer includes land grid array pads that are disposed at the front side of the interposer and includes through-silicon vias that connect the electrical contacts of the chips to the land grid array pads.

In one or more embodiments, the interposer is CTE-matched to the chips and includes a redistribution wiring layer 120 that is adjacent to the chips.

In one or more embodiments, the material of the manifold is a glass. In one or more embodiments, the material of the bottom portion 204 of the manifold is silicon. In one or more embodiments, the material of the microchannel cooler is silicon.

In one or more embodiments, the chip and cooler assembly 600 also includes a filled thermal epoxy, e.g., silver filled epoxy, 400 that attaches the microchannel cooler to the chips. In other embodiments, a metallic substance, material, or compound (e.g., indium foil, silver-tin solder) attaches the microchannel cooler to the chips.

In one or more embodiments, the module is between 2 mm and 25 mm thick. In some embodiments, the module is between 4 mm and 12 mm thick.

In one or more embodiments, the chip and cooler assembly also includes an underfill that adheres together the interposer, chips, frame, and cooler and filling gaps therebetween.

In one or more embodiments, the frame has multiple pieces. In one or more embodiments, the multiple pieces include multiple layers; e.g., multiple layers of silicon joined together as discussed elsewhere herein—see FIG. 11 layers 1116, 1118, 1120, 1122. In one or more embodiments, the multiple layers include a first layer that extends along all edges of the assembly, and a second layer atop the first layer; the second layer (e.g., 1122 at right side but not left side of FIG. 11) extends along a first edge of the assembly, but does not extend along an edge of the assembly that is opposite from the first edge.

In one or more embodiments, the chip and cooler assembly 600 also includes a loading block 700 atop the manifold, wherein the loading block has holes matching holes of the manifold, has compliant members (e.g., O-rings) that surround the matched holes, and has additional compliant members (e.g., O-rings) distributed in a uniform array across the interface of the loading block and the manifold.

In one or more embodiments, the manifold includes a top piece 206 and a bottom piece 204, with a central inlet hole 224 and two peripheral outlet holes 222 that extend from the top of the manifold through the top piece to grooves 220, 218 that run across the bottom of the top piece, and the bottom piece includes a plurality of holes 212 that open from each groove through the bottom piece to the microchannel cooler.

In one or more embodiments, the chip and cooler assembly also includes a glass frit that joins the top piece of the manifold to the bottom piece of the manifold and joins the bottom piece of the manifold to the microchannel cooler.

According to another aspect, referring to FIG. 10, an exemplary method 1000 includes, at 1002, assembling a plurality of chips onto a back side of an interposer. The chips are CTE-matched to the interposer. The method also includes, at 1004, assembling a frame into gaps between the chips; at 1006, depositing a thermal epoxy 400 onto back sides of the chips; and at 1010, loading a chip cooler module 200 against the thermal epoxy. The microchannel cooler is CTE-matched to the chips and the interposer.

In one or more embodiments, the method 1000 also includes, at 1008, forming the chip cooler module 200 by attaching a manifold 204, 206 to the microchannel cooler 202; and, at 1012, filling an underfill 602 into gaps between the chips, the frame, the microchannel, and the interposer.

In one or more embodiments, the method 1000 also includes, at 1014, combining the thermal expansion matched chip and cooler assembly 600 and a loading block 700 with a first plurality of O-rings connecting holes of the loading block 700 to holes of the upper manifold 206 and with a second plurality of O-rings distributing mechanical load across the interface of the loading block and the manifold.

In one or more embodiments, the method 1000 also includes, at 1016, loading the chip and cooler assembly into a land grid array socket with pressure on the loading block.

In one or more embodiments, the method 1000 also includes, at 1018, flowing a coolant from the loading block through the manifold.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A chip and cooler assembly comprising:
an interposer that has a front side and a back side;
a plurality of integrated circuit chips that are mounted onto the back side of the interposer, wherein each of the integrated circuit chips has a front side that is attached to the interposer and a back side that faces away from the interposer, wherein gaps separate the integrated circuit chips;
a frame that is fitted around the integrated circuit chips, wherein the frame is coefficient of thermal expansion (CTE)-matched to the integrated circuit chips, wherein the frame and the integrated circuit chips define a back side surface; and
a cooler module that is attached to the back side surface, the cooler module being CTE-matched to the integrated circuit chips, and the cooler module comprising a microchannel cooler that is disposed against the back sides of the integrated circuit chips and a manifold that is attached to the microchannel cooler opposite the integrated circuit chips, the manifold being CTE-matched to the microchannel cooler, and comprising a top piece and a bottom piece bonded together, wherein a material of the manifold comprises a glass.

2. The chip and cooler assembly of claim 1, further comprising:
a plurality of thinner chips that are embedded in portions of the gaps between the plurality of integrated circuit chips, wherein the frame is thinner above the thinner chips and is thicker where the thinner chips are not present.

3. The chip and cooler assembly of claim 1, wherein the integrated circuit chips have electrical contacts at their front sides, and the interposer comprises land grid array pads that are disposed at the front side of the interposer further comprises through vias that connect the electrical contacts of the integrated circuit chips to the land grid array pads.

4. The chip and cooler assembly of claim 1, wherein the interposer is CTE-matched to the integrated circuit chips and includes a redistribution wiring layer that is adjacent to the integrated circuit chips.

5. The chip and cooler assembly of claim 1, wherein at least one of the integrated circuit chips is mounted to the interposer by hybrid bonds.

6. The chip and cooler assembly of claim 1, wherein the frame comprises multiple pieces.

7. The chip and cooler assembly of claim 6, wherein the multiple pieces comprise multiple layers of silicon joined together.

8. The chip and cooler assembly of claim 7, wherein the multiple layers include a first layer that is present around an entire edge of the chip and cooler assembly and a second layer atop the first layer, wherein the second layer is present at a first side of the chip and cooler assembly but is not present at a side of the chip and cooler assembly that is opposite the first side.

9. The chip and cooler assembly of claim 1, further comprising a filled thermal rigid adhesive that attaches the microchannel cooler to the integrated circuit chips.

10. The chip and cooler assembly of claim 1, further comprising a metallic substance that attaches the microchannel cooler to the integrated circuit chips.

11. The chip and cooler assembly of claim 1, wherein the chip and cooler assembly is between 2 mm and 25 mm thick.

12. The chip and cooler assembly of claim 1, wherein the chip and cooler assembly is between 4 mm and 12 mm thick.

13. The chip and cooler assembly of claim 1, further comprising a filled material that adheres together the interposer, the frame, the integrated circuit chips, and the microchannel cooler and fills gaps therebetween.

14. The chip and cooler assembly of claim 13, wherein the filled material has a CTE between about $0.6 \times 10^{-6}$/K and about $5.8 \times 10^{-6}$/K.

15. The chip and cooler assembly of claim 1, further comprising a loading block atop the manifold, wherein the loading block has holes matching holes of the manifold, has O-rings surrounding the holes of the loading block, and has additional O-rings distributed in a uniform array across an interface of the loading block and the manifold.

16. The chip and cooler assembly of claim 15, wherein the top piece comprises one or more inlet holes and one or more outlet holes that extend from a top of the manifold through the top piece to grooves that run across a bottom of the top piece, and wherein the bottom piece comprises a plurality of holes that open from each groove through the bottom piece to the microchannel cooler.

17. The chip and cooler assembly of claim 1, wherein the interposer is an active interposer.

\* \* \* \* \*